(12) United States Patent
Hollenbeck et al.

(10) Patent No.: US 7,382,039 B2
(45) Date of Patent: Jun. 3, 2008

(54) EDGE SEAL FOR IMPROVING INTEGRATED CIRCUIT NOISE ISOLATION

(75) Inventors: Neal W. Hollenbeck, Palatine, IL (US); Kenneth R. Haddad, Arlington Heights, IL (US); William J. Roeckner, Carpentersville, IL (US)

(73) Assignees: Freescale Semiconductor, Inc., Austin, TX (US); Motorola, Inc., Schaumburg, IL (US)

( * ) Notice: Subject to any disclaimer, the term of this patent is extended or adjusted under 35 U.S.C. 154(b) by 81 days.

(21) Appl. No.: 11/349,608

(22) Filed: Feb. 8, 2006

(65) Prior Publication Data

US 2007/0181981 A1    Aug. 9, 2007

(51) Int. Cl.
H01L 21/50 (2006.01)
(52) U.S. Cl. ................................ 257/620; 257/758
(58) Field of Classification Search ........... 257/620, 257/758
See application file for complete search history.

(56) References Cited

U.S. PATENT DOCUMENTS 6,078,068 A    6/2000   Tamura
6,815,821 B2 * 11/2004 Yu ........................... 257/758
2003/0122235 A1 * 7/2003 Tsai et al. ................ 257/678
2005/0110119 A1 * 5/2005 Chen ....................... 257/620

* cited by examiner

Primary Examiner—Phat X Cao
(74) Attorney, Agent, or Firm—Brinks Hofer Gilson & Lione (57) ABSTRACT

An edge seal structure and fabrication method are described. The edge seal structure includes a high impedance substrate containing a base material and a grounded floating edge seal that is on the substrate but is isolated from the base material. The edge seal contacts a first doped well in the substrate that has the same conductivity type as and is more heavily doped than the base material. The first doped well is in a second doped well that has a different conductivity type than the first doped well. The first and second doped wells and the base material form back-to-back series connected diodes. The wells are effectively connected to power and ground such that the diodes are reverse-biased. The edge seal is formed by a stack of conductive layers, at least some of which are surrounded by a stack of insulating layers.

13 Claims, 5 Drawing Sheets

EDGE SEAL FOR IMPROVING INTEGRATED CIRCUIT NOISE ISOLATION

TECHNICAL FIELD

The present embodiments relate to an integrated circuit. More specifically, the present embodiments relate to an integrated circuit having an edge seal.

BACKGROUND

Integrated circuits are used in the vast majority of modern electronic devices. An integrated circuit is formed by fabricating devices on/in a wafer. The wafer contains at least one die (also referred to as a chip), which in turn contains an integrated circuit. The integrated circuit, in general, may provide multiple functions. The circuitry that provides each of these functions often is sensitive to electrical signals generated from other nearby circuitry of the integrated circuit. Accordingly, the sensitive circuits are isolated from other circuits. Thus, isolation is becoming increasingly important due to higher levels of integration (which increases the noise between circuits), higher frequencies used to communicate signals in the integrated circuit (which increases the coupling between the circuits), and tighter specifications for new devices.

Integrated circuits are typically isolated, for example, by fabricating the circuits relatively far apart on the die from the other circuits. The circuits are disposed relatively far from each other to increase the resistance between the circuits and thereby better isolate the circuits. The resistance is characteristic of the substrate in which the circuits are fabricated.

In some fabrication processes, however, a grounded metallized ring (edge seal) contacting the substrate is placed around the outside of the die to seal the edge from contaminating ions that affect the yield during processing and affect performance of the chip after the chip has been fabricated. In addition, the edge seal is grounded to the substrate.

Accordingly, the edge seal acts as a low-impedance path between different regions on the die. This means that isolation between circuits in these regions is limited by the edge seal, which effectively shorts out a substantial amount of the electrical connection through the substrate. For example, if two circuits are located near the edges of the substrate and are 2000 microns apart, the resistance between the grounds may be several hundred ohms. If an edge seal is placed around the perimeter of the die 10 microns from each circuit, the effective distance between the circuits is now only 20 microns apart. This consequently decreases the isolation of the resistance by a factor of 100 due to the low impedance metal connection around the die.

BRIEF DESCRIPTION OF THE DRAWINGS

The present invention is illustrated by way of example and not limited to the accompanying figures in which like references indicate similar elements.

Skilled artisans appreciate that elements in the figures are illustrated for simplicity and clarity and have not necessarily been drawn to scale.

DETAILED DESCRIPTION

A protective edge seal is provided that is isolated from the base material forming the substrate. The edge seal is disposed around an integrated circuit. The edge seal includes a stack of conductive materials of which the lowermost layer contacts a doped well formed within the substrate. The well is doped such that at least one diode is formed between the edge seal and the base material. The diodes formed by the wells thus provide isolation between the edge seal and the substrate, i.e. permit the edge seal to float rather than be grounded to the substrate. The edge seal provides a barrier to ionic contaminants and supplies mechanical support for the die.

Figure 1:
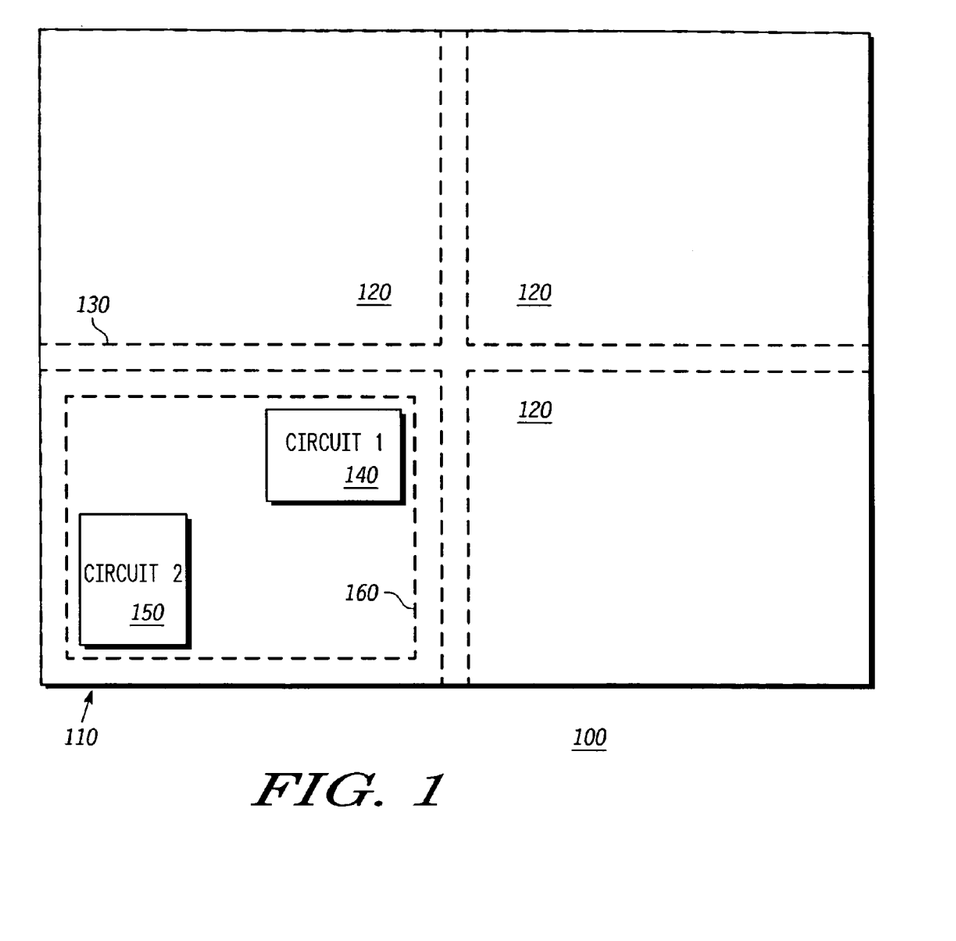
FIG. 1 is a top view of an edge seal structure according to one embodiment.

FIG. 1 illustrates a wafer 100 containing several die (or chips) 120. Each die 120 comprises a substrate 110 on/in which various elements are fabricated or disposed. The wafer 100, and thus the base material of the substrate 110, comprises a semiconductor material in one embodiment. Specifically, the semiconductor material may comprise an elemental semiconductor such as Si or Ge, or a compound semiconductor such as group IV elements (e.g. SiGe, SiC), III-V elements (e.g. GaAs, InP), or II-VI elements (e.g. CdS, ZnSe). The compound semiconductor may be a binary compound such as InP, a ternary compound such as InGaP, a quatranary compound such as InGaAsP, etc. More specifically, in one embodiment, the base material is a high impedance semiconductor material. The high impedance semiconductor material may be relatively pure/intrinsic semiconductor material (having a low dopant concentration) or may be highly compensated semiconductor material (having a higher dopant concentration than intrinsic material but relatively equal amounts of dopants of opposing carrier types).

In general, multiple die 120 are formed on each wafer 100. Although only four die 120 are shown in FIG. 100, several hundred or thousand die may be formed on a single wafer, dependent on the relative sizes of the wafer and the die, among others. The processes used to form the die (e.g. metallization, deposition, implantation, etching, cleaning) are typically applied to the entire wafer to form the die. Moreover, multiple different die may be fabricated on the same wafer using the same processes. In any case, as shown in FIG. 1, at the edges of each of the die 120, a cutting line 130 is formed. This permits a cutting device such as a dicing saw to cut along the cutting line 130 and separate the wafer 100 into individual die 120 after fabrication is completed. The individual die are then packaged.

Of the die 120 shown in FIG. 1, specific elements are shown on only one die 120. The elements formed on and/or in the substrate 110 include integrated circuits and an edge seal 160. The integrated circuits include first and second circuits 140 and 150. At least one of the first and second circuits 140 and 150 contains circuitry that is sensitive to electrical signals generated from the other of the first and second circuits 140 and 150. The first and second circuits 140 and 150 can both be RF (radio frequency) circuits, for example, or one of the first and second circuits 140 and 150 can be an analog circuit while the other of the first and second circuits 140 and 150 is a digital circuit. In one specific example, the first and second circuits 140 and 150 can include high speed RF CMOS (complementary metal oxide semiconductor) circuits and BiCMOS (BIpolarC-MOS—a type of integrated circuit that uses both bipolar and CMOS technologies). Other circuits may also be present on the die 120, but are not shown for clarity.

The edge seal 160 is disposed around the perimeter of the substrate 110 containing the first and second circuits 140 and 150. The edge seal 160 is usually disposed within about 10 μm from the cutting line 130. The edge seal 160 protects the integrated circuits surrounded by the edge seal 160 against contamination during and after processing.

Figure 2:
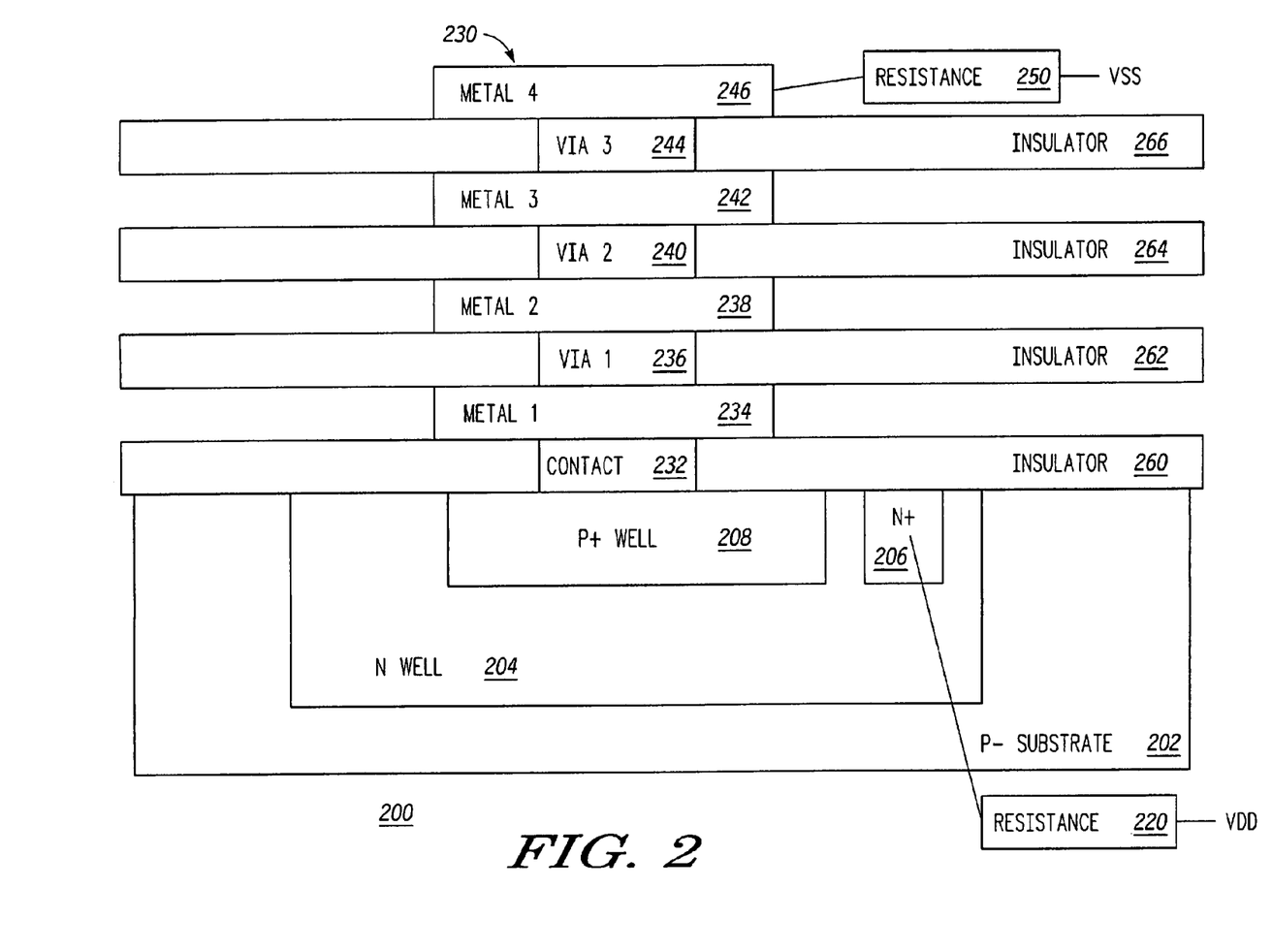
FIG. 2 is a cross-sectional view of the edge seal structure of FIG. 1.

FIG. 2 illustrates a cross-sectional view of the edge seal structure 200. The edge seal structure 200 includes an edge seal 230. The edge seal 230 contains various conductive layers 232-246 formed on a high impedance substrate 202. The conductive layers 232-246 include vias 236, 240, and 244 that are disposed within insulating layers 262-266. Contact layer 232 is disposed within insulating layer 260. The use of a high impedance substrate permits fabrication of integrated inductors into the circuit. The conductive layers 232-246 are typically formed from a metal such as Al, Cu, W, Au, Ag, Pt, or Ti or a conductive material such as ITO (indium tin oxide) or IZO (indium zinc oxide). Although four metal layers 234, 238, 242, and 246, three vias 236, 240, and 244, and a contact layer 232 are shown, fewer or more conductive layers may be present.

Similarly, fewer or more insulating layers may be formed. The insulating layers 260-266 are formed from materials such as $SiO_x$, $SiN_x$, or other dielectrics such as dielectrics having a high dielectric constant (high k dielectrics). In addition, although the conductive layers 232-246 and insulating layers 260-266 are shown as being single layers, any of these conductive layers 232-246 and/or insulating layers 260-266 may be multilayer structures.

In one embodiment, the conductive layers 232-246 and insulating layers 260-266 are the same layers used to fabricate the integrated circuits. Accordingly, the number of conductive layers 232-246 and insulating layers 260-266 depends on the number of layers used to create the integrated circuit.

The conductive layers 232-246 may be isolated from all circuits on the die in one embodiment. In another embodiment, one or more of the conductive layers 232-246 may contact one or more integrated elements/circuits on the substrate 202, in which case the edge seal 230 may be separated into segments, as discussed below. The metal layers 234, 238, 242, and 246, in addition to the vias 236, 240, and 244, may be isolated by dielectric layers. Methods of forming the metal layers 234, 238, 242, 248, vias 232, 236, 240, 246 and/or insulating layers 260-266 are well known to one of skill in the art and will not be further described here.

As described above, the substrate 202 is formed from a grounded high impedance base material. As shown in FIG. 2, this material is a lightly doped (e.g. $<10^{15}$ $cm^{-3}$) p-type semiconductor material, such as Si. In the substrate 202, an n-type well 204 is formed. The n-type well 204 is moderately doped (e.g. $10^{16}$ $cm^{-3} < n < 10^{17}$ $cm^{-3}$). In the n-type well 204, two further wells 206 and 208 are formed. The two wells are heavily doped (e.g. $10^{18}$ $cm^{-3} < n$). One of the wells is n-type (i.e. $n^+$ well 206) and the other of the wells is p-type (i.e. $p^+$ well 208).

As illustrated in FIG. 2, the contact layer 232 contacts the $p^+$ well 208. Accordingly, the material forming the contact layer 232 is selected such that it forms an ohmic contact with the $p^+$ well 208. Similarly, a contact layer (not shown) makes ohmic contact to the $n^+$ well 206.

Each of the wells 204, 206, 208 is fabricated by standard lithographic techniques. Either the same doping technique (such as ion implantation) or different doping techniques may be used to form each of the wells 204, 206, 208. More specifically, to form the wells 204, 206, 208, a positive or negative photoresist is deposited on the entire substrate. Using positive photoresist, the photoresist is masked and radiation supplied to the photoresist such that a portion of the substrate in which the n-type well 204 is to be formed is exposed to the radiation and the remainder of the photoresist is not exposed. The exposed photoresist is then developed away, leaving the unexposed photoresist. The remaining photoresist acts as a mask and an n-type dopant is, for example, implanted into the area of the substrate exposed through the photoresist and then perhaps driven into the substrate by annealing. The remaining photoresist is then stripped. Using negative photoresist, the steps are the same except that the photoresist is masked such that a portion of the substrate in which the n-type well 204 is to be formed is not exposed to the radiation and the remainder of the photoresist is exposed. The non-exposed photoresist is then developed away, leaving the exposed photoresist. Although fabrication of only the n-type well 204 is discussed in detail, the $n^+$ well 206 and the $p^+$ well 208 are individually fabricated in a similar manner.

Figure 3:
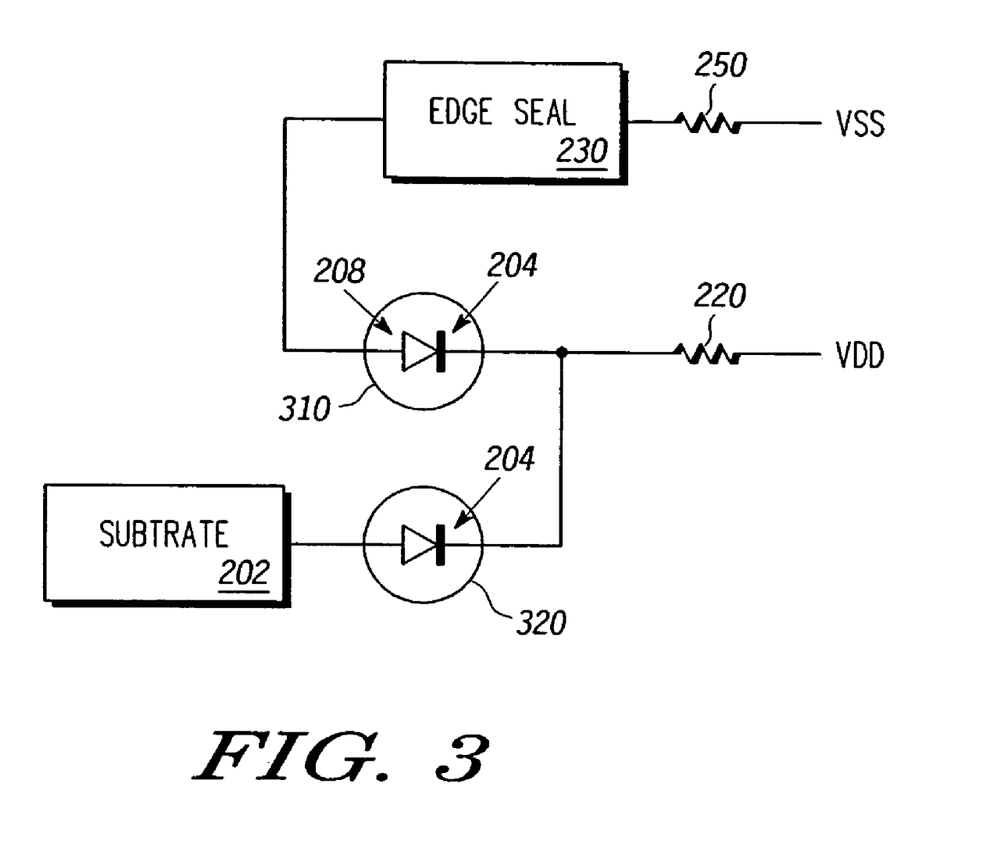
FIG. 3 is a basic circuit diagram illustrating an embodiment of the edge seal structure.

Turning to FIG. 2 again, the topmost conductive layer 246 is connected to potential Vss through a first resistance 250. Power Vdd is supplied to the $n^+$ well 206 through a second resistance 220 connected to the contact layer (not shown) to the $n^+$ well 206. Potential Vss may be any potential lower than power Vdd. For example, potential Vss may be ground. The first and second resistances 220, 250 can be dedicated resistors that are integrated or are discrete electronic components. Alternatively, the first and second resistances 220, 250 may be eliminated. The $n^+$ well 206 permits the contact layer (not shown) to better effect electrical contact to the n well 204. Thus, as illustrated in FIG. 3, the wells 204, 206, 208 form back-to-back diodes 310, 320 that isolate the edge seal 230 from the substrate 202.

More specifically, the combination of the $p^+$ well 208 and the n well 204 form a first diode 310. Similarly, the combination of the n well 204 and the $p^-$ substrate 202 form a second diode 320. The first diode 310 is reverse-biased by the application of ground Vss to the $p^+$ well 208 through the conductive edge seal 230 and power Vdd to the $n^+$ well 206. The second diode 320 is reverse-biased by the application of power Vdd to the $n^+$ well 206 and the substrate 202 being grounded. The wells 204, 206, 208, like the conductive layers 232-246, form a ring around the integrated circuit formed on/in the substrate 202.

Although the edge seal 230 and the substrate 202 are still capacitively coupled through the diodes 310, 320, application of power Vdd to the $n^+$ well 206 also increases the depletion width at the interface of the n well 204 and the $p^-$ substrate 202, thereby decreasing the capacitance of the diodes 310, 320 and thus the capacitive coupling. In addition, the substrate 202 may contain multiple isolated grounds for different circuits on the substrate 202. Accordingly, each on-chip ground is protected through diodes to the edge seal structure 200.

Figure 4:
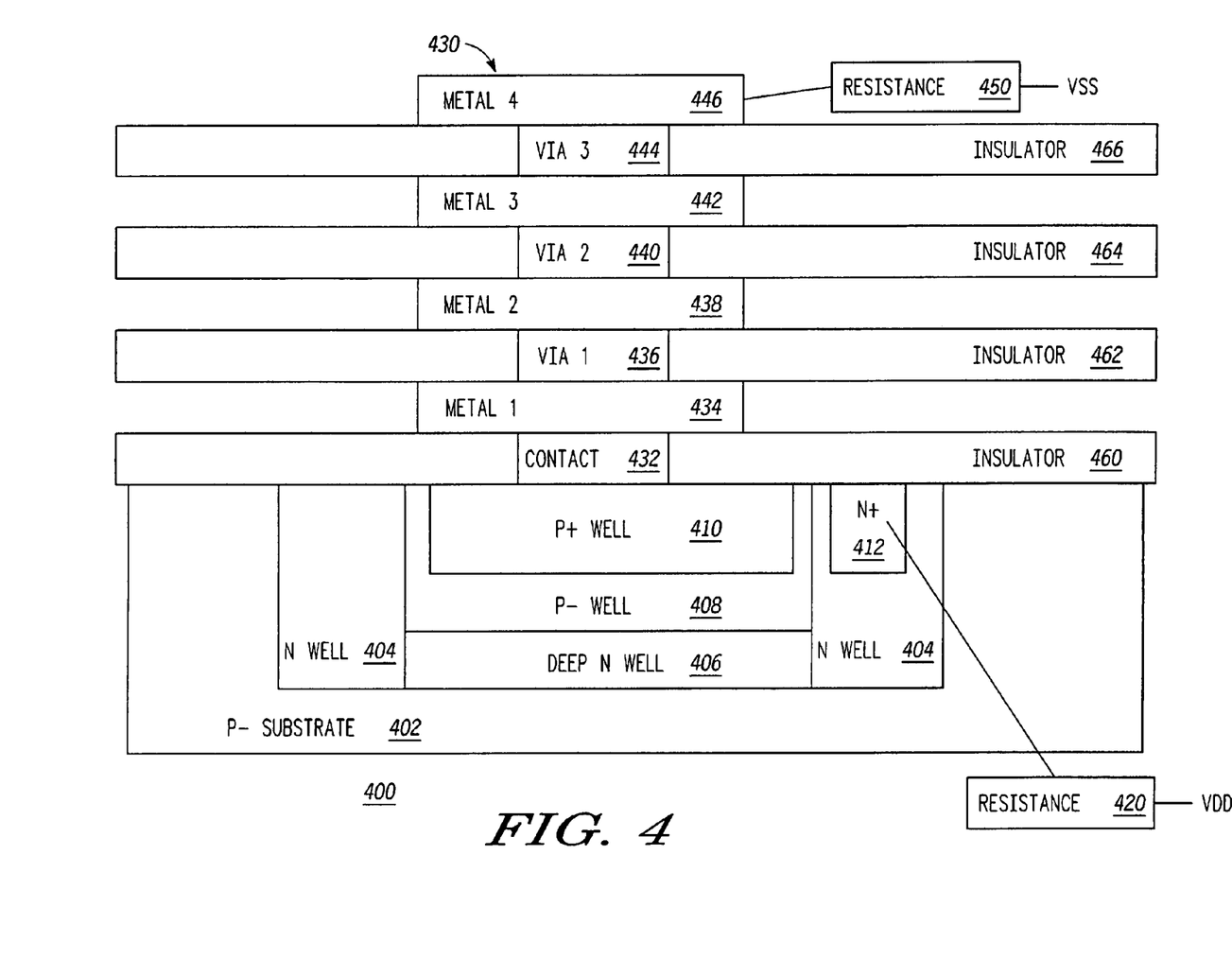
FIG. 4 is a cross-sectional view of an edge seal structure according to another embodiment.

FIG. 4 illustrates a cross-sectional view of the edge seal structure 400 according to another embodiment. Similar to the edge seal structure 200 shown in FIG. 2, the edge seal structure 400 of FIG. 4 includes an edge seal 430. The edge seal 430 contains conductive layers 432-446 that are disposed within insulating layers 460-466 formed on a high impedance grounded substrate 402.

Unlike FIG. 2, however, the overall well structures within the substrate 402 are different. As illustrated in FIG. 4, the contact layer 432 contacts a p$^+$ well 410 formed within a p$^-$ well 408. The p$^-$ well 408 is formed within a deep n well 406, which is in turn formed within the p$^-$ substrate 402. An n$^+$ well 412 is formed within an n well 404, which is again formed within the p$^-$ substrate 402. The n well 404 may be formed in a separate implantation/diffusion from the deep n well 406, in which the n well 404 is formed after the p$^-$ well 408 is formed. Alternatively, the n well 404 may be a portion of the deep n well 406. As described above, each of the wells 404-412 are fabricated by standard lithographic techniques. Similar to the embodiment of FIG. 2, the wells 404-412 of the embodiment of FIG. 4 form the back-to-back diodes 310, 320 shown in FIG. 3 that isolate the edge seal 430 from the substrate 402.

In addition, other embodiments are possible. For example, the doping of the various wells can be altered as desired. In one particular example, the doping of the p$^+$ well contacted by the edge seal can be decreased to a relatively low doping, so as to make a p or p$^-$ well, or removed entirely, so long as the edge seal can adhere to the surface of the well. If the p-type well is completely removed, the metal used to contact the n well is selected to form a Schottky barrier with the underlying n-type well. In other embodiments, the edge seal (and perhaps the doped wells) may not form a continuous ring around the integrated circuit but instead may have multiple segments separated by air or another dielectric. In this case, different grounds may be used to ground the different segments.

Tuner integrated circuits were fabricated on a Si substrate using a conventional edge seal structure (grounded to the substrate) and an embodiment of the present edge seal structure (isolated from the substrate). Each tuner integrated circuit fabricated integrated a dual conversion receiver, which had multiple local oscillators and mixers, on one die. Coupling can occur between the mixers and between RF and digital sections of the die, which causes noise and degrades overall performance.

Figure 5:
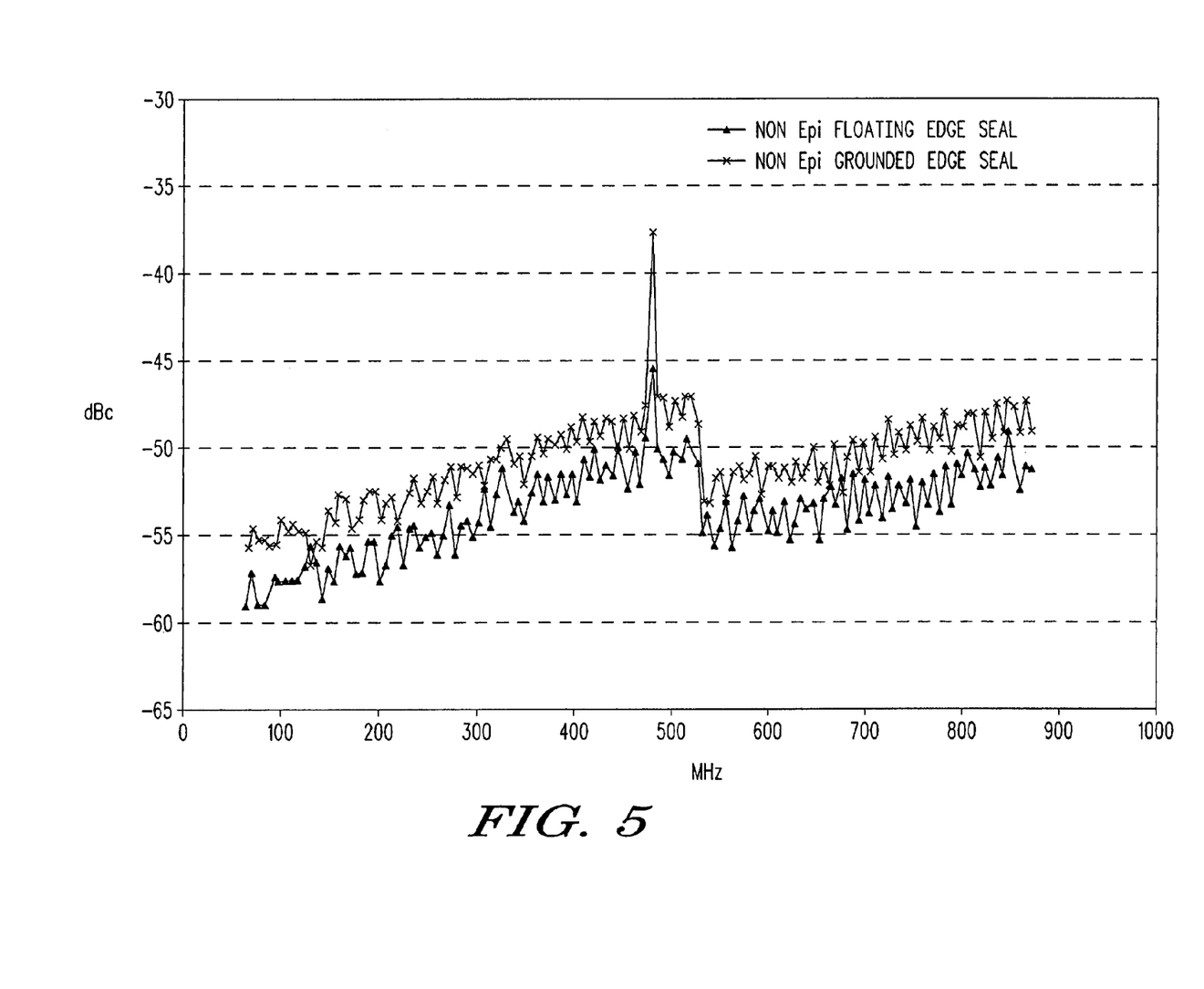
FIG. 5 is a plot of the spur performance for an integrated tuner using a conventional edge seal structure and an integrated tuner using an edge seal structure according to an embodiment.

The spur performance for the tuner integrated circuit on a non-epitaxial grown substrate is shown in FIG. 5. The only difference between the integrated circuits in the two plots is the edge seal structure. As the plot shows, the average improvement is 2.6 dB (about 40% decrease in coupled power), with a 7.8 dB (about 80% decrease in coupled power) improvement for the worst case spur at 471 MHz. The 471 MHz spur is 11 dB above for the typical edge seal, and only 5.5 dB above for the floating edge seal.

Thus, an edge seal structure is presented in which the edge seal is not directly connected to the lightly doped base material of the substrate. Instead, the stack of conductors comprising the edge seal is connected to a heavily doped well, which is disposed in another well of a different conductivity type. This provides a diode between the edge seal and the substrate, which significantly improves the isolation performance of the integrated circuit that the edge seal surrounds. The floating edge seal provides mechanical support for the die, a barrier against ionic contaminants, and protection against external electrostatic discharge using series-connected back-to-back reverse biased diodes integrated into the substrate without supplying a low impedance path around the circumference of the chip.

This permits increased separation of a relatively noisy portion of the integrated circuit (e.g. digital clock) from a sensitive portion of the integrated circuit (e.g. analog RF elements) using the resistance of the substrate to decrease crosstalk between the noisy and sensitive portions without having coupling through the edge seal. Thus, the edge seal structure is useful as geometries shrink to 90 nm process technologies (and beyond) and as more digital functions are integrated with RF functions.

Note that the specification and figures are to be regarded in an illustrative rather than a restrictive sense, and all such modifications are intended to be included within the scope of present invention. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

We claim:

1. An integrated circuit edge seal structure comprising:
    a substrate containing a base material, the substrate comprising a first doped well disposed in the base material and a second doped well in which the first doped well is disposed, wherein the first and second doped wells have different conductivity types to form a first diode, the second doped well and the substrate have different conductivity types to form a second diode, and the first and second diodes are connected to ground and a power supply such that the first and second diodes are reversed biased; and
    a conductive edge seal disposed on the substrate, the edge seal electrically isolated from the base material.

2. The edge seal structure of claim 1, further comprising a resistor through which each of the first and second diodes is connected to ground or the power supply, respectively.

3. The edge seal structure of claim 1, wherein the edge seal comprises a stack of conductive layers at least some of which are surrounded by a stack of insulating layers.

4. The edge seal structure of claim 1, wherein the edge seal is grounded.

5. An integrated circuit edge seal structure comprising:
    a substrate containing a base material, wherein the substrate comprises a first doped well disposed in the base material, a second doped well in which the first doped well is disposed, and a third doped well disposed in the second doped well adjacent to the first doped well, the first and second doped wells having different conductivity types to form a first diode, the second and third doped wells having the same conductivity type, and the third doped well more heavily doped than the second doped well; and
    a conductive edge seal disposed on the substrate, the edge seal electrically isolated from the base material.

6. An integrated circuit edge seal structure comprising:
    a substrate containing a base material, wherein the substrate comprises a first doped well disposed in the base material, a second doped well in which the first doped well is disposed, and a third doped well disposed in the second doped well, the first and second doped wells having different conductivity types to form a first diode, the first doped well disposed in the third doped well, the first and third doped wells having the same conductivity type, and the first doped well more heavily doped than the third doped well; and a conductive edge seal disposed on the substrate, the edge seal electrically isolated from the base material.

7. The edge seal structure of claim 6, wherein the second doped well has a different conductivity type than the substrate to form a second diode.

8. A chip comprising:

a substrate containing a first doped well disposed inside a second doped well, the substrate and the first doped well having a different conductivity type than the second doped well, wherein the first doped well and the second doped well form a first diode, the second doped well and the substrate form a second diode, and the first and second diodes are connected to ground and a power supply such that the first and second diodes are reverse biased;

an edge seal containing at least two conductive layers on the substrate, the at least two conductive layers including a contact layer that contacts the first doped well; and an integrated circuit on the substrate at least partially surrounded by the edge seal.

9. The chip of claim 8, further comprising a resistor through which each of the first and second diodes is connected to ground or the power supply, respectively.

10. The chip of claim 8, wherein the substrate contains a third doped well disposed in the second doped well adjacent to the first doped welt, the second and third doped wells having the same conductivity type, the third doped well more heavily doped than the second doped well.

11. The chip of claim 8, wherein the substrate contains a third doped well disposed in the second doped well, the first well disposed in the third doped well, the first and third doped wells having the same conductivity type, the first doped well more heavily doped than the third doped well.

12. The chip of claim 8, wherein the substrate is a high impedance substrate.

13. The chip of claim 8, wherein the edge seal is grounded.

\* \* \* \* \*

UNITED STATES PATENT AND TRADEMARK OFFICE
CERTIFICATE OF CORRECTION

PATENT NO. : 7,382,039 B2  
APPLICATION NO. : 11/349608  
DATED : June 3, 2008  
INVENTOR(S) : Neal W. Hollenbeck et al.

Page 1 of 1

It is certified that error appears in the above-identified patent and that said Letters Patent is hereby corrected as shown below:

<u>In the Claims</u>

In column 8, claim 10, line 8, after "to the first doped" delete "welt" and substitute --well-- in its place.

Signed and Sealed this

Fourteenth Day of April, 2009

JOHN DOLL  
*Acting Director of the United States Patent and Trademark Office*